(12) United States Patent
Jürgensen et al.

(10) Patent No.: US 7,332,038 B2
(45) Date of Patent: Feb. 19, 2008

(54) DEVICE FOR DEPOSITING IN PARTICULAR CRYSTALLINE LAYERS ON ONE OR MORE, IN PARTICULAR LIKEWISE CRYSTALLINE SUBSTRATES

(75) Inventors: Holger Jürgensen, Aachen (DE); Gerhard Karl Strauch, Aachen (DE); Johannes Käppeler, Würselen (DE)

(73) Assignee: Aixtron AG (DE)

( * ) Notice: Subject to any disclaimer, the term of this patent is extended or adjusted under 35 U.S.C. 154(b) by 376 days.

(21) Appl. No.: 10/378,493

(22) Filed: Mar. 3, 2003

(65) Prior Publication Data

US 2004/0003779 A1    Jan. 8, 2004

Related U.S. Application Data

(63) Continuation of application No. PCT/EP01/08886, filed on Aug. 1, 2001.

(30) Foreign Application Priority Data

Sep. 1, 2000    (DE) .................. 100 43 599

(51) Int. Cl.
  *C23C 16/00*    (2006.01)
  *C23C 16/455*    (2006.01)
  *C23C 16/458*    (2006.01)
  *H01L 21/306*    (2006.01)

(52) U.S. Cl. .................. 118/715; 118/724; 118/725; 118/728; 156/345.29; 156/345.33; 156/345.51; 156/345.52

(58) Field of Classification Search .............. 118/715, 118/724, 725, 728, 730; 156/345.29, 345.33, 156/345.51, 345.52, 345.55
See application file for complete search history.

(56) References Cited

U.S. PATENT DOCUMENTS

| | | | | |
|---|---|---|---|---|
| 4,888,142 | A | * 12/1989 | Hayashi et al. | ............... 264/81 |
| 4,976,217 | A | 12/1990 | Frijlink | ...................... 118/733 |
| 5,653,808 | A | * 8/1997 | MacLeish et al. | .......... 118/715 |
| 5,788,777 | A | 8/1998 | Burk, Jr. | ...................... 118/730 |
| 5,891,251 | A | * 4/1999 | MacLeish et al. | .......... 118/719 |
| 6,113,984 | A | * 9/2000 | MacLeish et al. | ..... 427/255.32 |
| 6,153,012 | A | * 11/2000 | Rupp et al. | ................. 118/715 |
| 6,325,855 | B1 | * 12/2001 | Sillmon et al. | ............. 118/715 |
| 6,475,286 | B1 | * 11/2002 | Frijlink | ...................... 118/719 |
| 6,481,368 | B1 | * 11/2002 | Lofgren et al. | ........... 118/723 I |
| 6,666,920 | B1 | * 12/2003 | Sillmon et al. | ............. 118/715 |
| 6,676,758 | B2 | * 1/2004 | Sillmon et al. | ............. 118/715 |
| 6,716,289 | B1 | * 4/2004 | Sillmon et al. | ............. 118/733 |
| 6,899,764 | B2 | * 5/2005 | Frijlink | ...................... 118/719 |

(Continued)

FOREIGN PATENT DOCUMENTS

JP    2003-188161    * 7/2003

*Primary Examiner*—Jeffrie R Lund
(74) *Attorney, Agent, or Firm*—St. Onge Steward Johnston & Reens LLC

(57) ABSTRACT

A device for depositing crystalline layers onto one or more substrates in a process chamber, including: a reverse-heatable support plate which forms a wall of the process chamber and which is heated with a high frequency and is formed of inertly coated graphite; a gas inlet mechanism which is located in the center of the process chamber having a cover plate that is situated at a distance from the support plate; and a gas outlet ring formed of solid graphite which forms the outer limit of the process chamber and which has a plurality of radial gas outlets.

8 Claims, 1 Drawing Sheet

U.S. PATENT DOCUMENTS

| | | | |
|---|---|---|---|
| 6,905,548 B2* | 6/2005 | Jurgensen et al. | 118/715 |
| 7,067,012 B2* | 6/2006 | Jurgensen et al. | 118/730 |
| 7,147,718 B2* | 12/2006 | Jurgensen et al. | 118/715 |
| 2003/0180460 A1* | 9/2003 | Strauch et al. | 427/248.1 |
| 2003/0217696 A1* | 11/2003 | Jurgensen et al. | 118/715 |
| 2003/0221624 A1* | 12/2003 | Jurgensen et al. | 118/725 |
| 2004/0003779 A1* | 1/2004 | Jurgensen et al. | 118/723 I |
| 2004/0005731 A1* | 1/2004 | Jurgensen et al. | 438/100 |
| 2004/0200412 A1* | 10/2004 | Frijlink | 118/715 |
| 2006/0201427 A1* | 9/2006 | Jurgensen et al. | 118/715 |

* cited by examiner

DEVICE FOR DEPOSITING IN PARTICULAR CRYSTALLINE LAYERS ON ONE OR MORE, IN PARTICULAR LIKEWISE CRYSTALLINE SUBSTRATES

This application is a continuation of pending International Patent Application No. PCT/EP01/098886 filed Aug. 1, 2001, which designates the United States and claims priority of pending German Application No. 10043599, filed Sep. 1, 2000.

FIELD OF THE INVENTION

The invention relates to a device for depositing in particular crystalline layers on one or more, in particular likewise crystalline substrates in a process chamber by means of reaction gases which are introduced into the process chamber where they react pyrolytically, having a carrier plate which forms a wall of the process chamber, can be heated from the rear, in particular using high frequency and consists of in particular inert-coated graphite, having a gas-admission element, which is disposed in the center of the process chamber, the chamber being circular in cross section, and is associated with a cover plate which is disposed at a spacing from the carrier plate, and a gas-discharge ring, which forms the outer boundary of the process chamber and has a multiplicity of radial gas outlet openings.

A device of this type is already known from U.S. Pat. No. 4,976,216. This document discloses an epitaxy reactor having a carrier plate on which substrate holders are disposed in planetary fashion in order to be coated. The substrates are single-crystalline slices, known as wafers, which, depending on the particular process may consist of gallium arsenide, indium phosphide or silicon. Furthermore, the device has a gas-admission element, through which the process gases are fed to the process chamber. The process gases may be metal-organic compounds of metals from main group III and hydrides of elements from main group V. However, it is also known to use silane and propane as process gases. This is described in U.S. Pat. No. 5,788,777. This document also describes an annular gas collector which surrounds the carrier plate, which is heated from below. Furthermore, this document shows a cover plate which is disposed at a spacing from the carrier plate, so that the process chamber is delimited at the bottom by the carrier plate, at the top by the cover plate and in the circumferential direction by the gas collector. U.S. Pat. No. 4,976,217, which was mentioned in the introduction, also has a gas-discharge ring. This is formed from a strip of sheet molybdenum and forms a crown-shaped hollow body.

For the epitaxial growth of silicon carbide from the reaction gases silane and methane/propane, the temperature in the process chamber has to be relatively high. In particular, the temperature gradient in the gas phase between carrier plate and cover plate should be as even as possible. Also, the temperature of the carrier plate should remain virtually constant as far as possible over its entire surface.

The invention is therefore based on the object of keeping the isothermal profile within the process chamber as flat as possible.

This object is achieved by the invention described in the claims.

Claim 1 provides for the gas-discharge ring to consist of solid graphite. It is preferable for the cover plate also to consist of solid graphite and to be back-heated like the carrier plate.

On account of this configuration, the gas-discharge ring has an increased heat capacity and, at the same time, a good heat conduction, so that there is a uniform temperature transition from cover plate to carrier plate. The gas-discharge ring may form steps over which the cover plate engages and under which the carrier plate engages. Therefore, the gas-discharge ring in regions lies between cover plate and carrier plate. The width of the gas-discharge ring approximately corresponds to the spacing between carrier plate and cover plate. The gas-discharge ring is preferably produced as a single part made from graphite and has an SiC or TaC coating.

The edge of the cover plate and of the carrier plate projects into a rebate in the gas-discharge ring. There are no radial joints, which could be the cause of temperature inhomogeneities. Furthermore, the gas-discharge ring has an upper and a lower annular collar, the inner wall of which lies opposite the circumferential narrow wall of the carrier plate or of the cover plate. Although there is a small gap between the annular collar and the circumferential narrow wall, there is still sufficient heat transfer from the carrier plate or from the cover plate to the gas-discharge ring, so that the temperature of the upper annular collar approximately corresponds to the temperature at the edge of the cover plate, and the temperature of the lower annular collar approximately corresponds to the temperature of the edge of the carrier plate. The edge of the cover plate and of the carrier plate projects into a rebate in the gas-discharge ring. As two annular protuberances adjoin the outer wall of the gas-discharge ring, a U-shaped annular gap is formed between these protuberances. The gas outlet openings open out in this annular gap. On account of the good heat-conducting properties of graphite, the two annular protuberances are at a relatively high temperature, so that the annular gap and therefore the outlet points of the gas outlet openings are also sufficiently hot for the condensation of decomposition products at those locations to be reduced. Moreover, the annular protuberances have the task of carrying annular plates for guiding the exhaust-gas or being supported thereon. The carrier plate is heated by means of an HF coil located beneath it. The cover plate is heated by means of an HF coil located above it.

The two HF coils can be powered by separate HF generators. This allows individual regulation of substrate temperature and cover temperature. The substrate temperature is approximately 1600° C. For this purpose, the carrier plate, which preferably consists of graphite, is heated to a temperature of from 1700° C. to 1800° C. The surface temperature of the cover plate consisting of graphite is approximately 1600° C. The region of the cover plate which directly adjoins the gas-admission element is also at this type of high temperature. On account of cooling, the gas-admission element is at a temperature of less than 100° C.

BRIEF DESCRIPTION OF THE DRAWING

An exemplary embodiment of the invention is explained below with reference to accompanying drawings, in which.

DETAILED DESCRIPTION OF THE DRAWING

Figure 1:
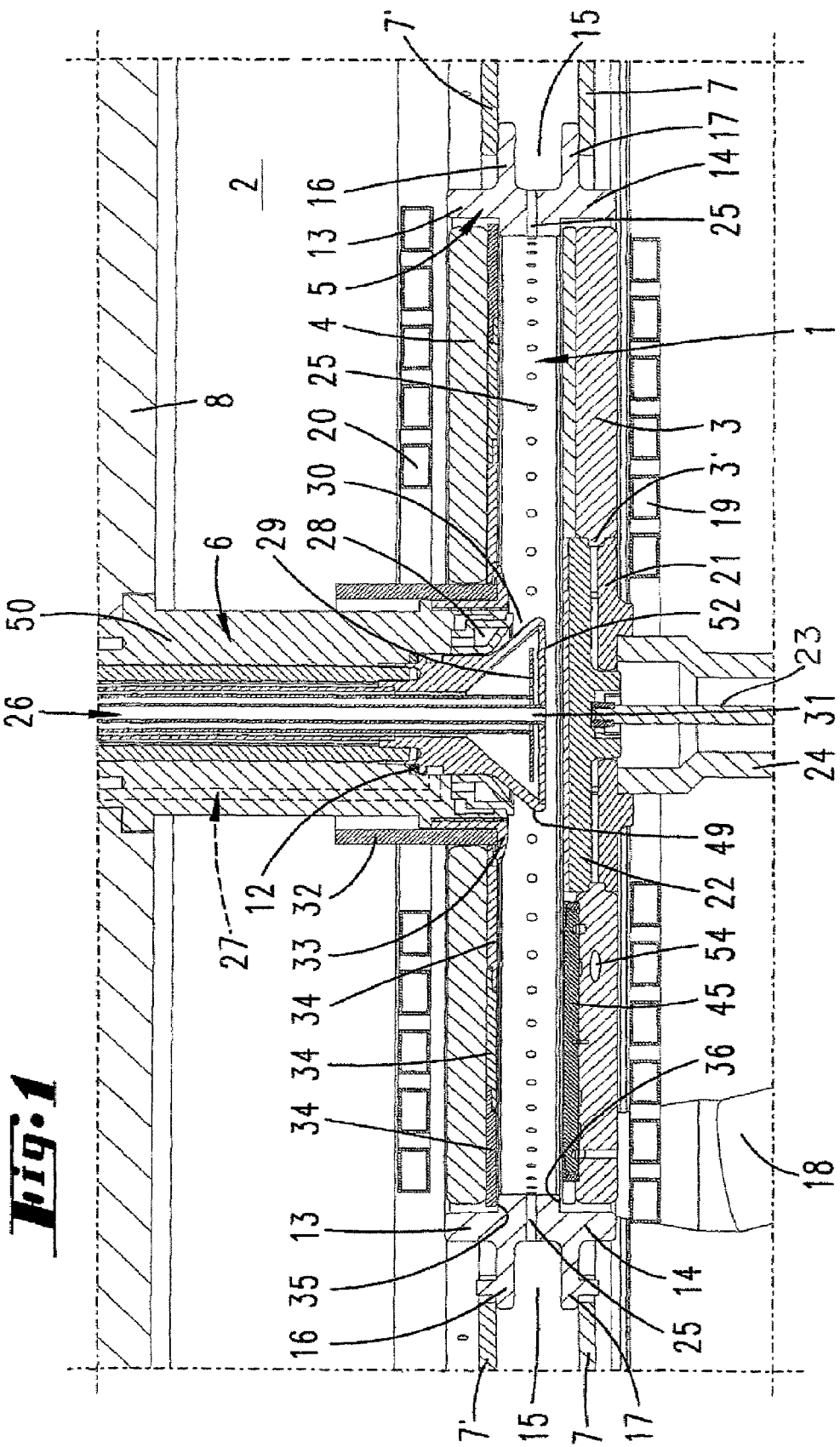
FIG. 1 shows, in diagrammatic representation, the reactor, comprising the process chamber disposed in a reactor housing.

The device which is illustrated in the exemplary embodiment is used for the monocrystalline deposition of SiC layers on monocrystalline Si substrates in a hot-wall reactor. These substrates may have a diameter of 4 inches.

The process chamber 1 is located in the reactor housing 2. This process chamber 1 has a carrier plate 3 which bears the substrate holders 45. Above the carrier plate 3, a cover plate 4 extends parallel to it. The carrier plate 3 is heated from below by means of a water-cooled HF coil 19. The cover plate 4 is heated from above by an HF coil 20, which is likewise water-cooled. The carrier plate 3 is of annular configuration, the outer diameter being approximately twice as great as the inner diameter. The inner wall of the carrier plate 3 has an annular step 3' which projects radially inward. By means of this annular step 3', the carrier plate 3 rests on the edge of a support plate 21. The support plate 21 is in turn supported on a supporting tube 24, through which a tie rod 23 projects. The tie rod 23 engages approximately centrally on a tension plate 22 which is disposed above the support plate 21 and the edge of which rests on the collar 3'. The carrier plate 3 is held as if by clamping jaws by tension applied to the tie rod 23.

The carrier plate 3 and the cover plate 4 are surrounded by a gas-discharge ring 5. This gas-discharge ring 5 forms the lateral process chamber wall. The edge region of the HF coils 19, 20 partially covers the gas-discharge ring 5. The gas-discharge ring 5 has a multiplicity of radial bores 25 through which the process gas can emerge. The gas-discharge ring 5, like the support plate 21, the tension plate 22, the carrier plate 3 and the cover plate 4 is made from solid graphite. It is in single-piece form and has a width which approximately corresponds to the height of the process chamber 1. As a result, the gas-discharge ring 5 has a relatively high heat capacity, with the result that the temperature profile within the process chamber is highly homogeneous even at the edge. Since the gas-discharge ring 5 forms a step 35 over which the cover plate 4 engages and a step 36 beneath which the carrier plate engages, in regions it projects into the space between the cover plate 4 and the carrier plate 3.

In the region of the step 35, the gas-discharge ring 5 has an upwardly projecting collar 13. The inner wall of the collar 13 lies opposite the narrow circumferential wall of the cover plate 4. An annular collar 14 also extends downward, and its radially inwardly directed inner wall lies opposite the radially outwardly directed narrow wall of the carrier plate 3.

Furthermore, the gas-discharge ring 14 has outwardly facing annular protuberances 16 and 17. These two annular protuberances 16, 17 are spaced apart from one another and define a U-shaped annular gap 15 into which the gas outlet openings 25 open out. The lower annular protuberance 17 is supported on an annular plate 7 made from quartz. The annular plate 7 is parallel to and at a spacing from an annular plate 7' which likewise consists of quartz and which is supported on the upper annular protuberance 16. Between the two annular plates 7 and 7' there is a passage through which the gas which has emerged through the gas outlet opening 25 is passed to an exhaust 18.

On its underside, the cover plate 4 is lined with a total of three lining rings 34. These lining rings may consist of graphite or of TaC. They are held together like furnace rings by mutual engagement over one another, the innermost ring 34 being supported on an annular collar of a graphite carrier 33 which is screwed onto the lower end of a gas-admission element 6.

The gas-admission element 6 is overall of two-part configuration. It has a core, which forms a section 49 which projects into the process chamber 1 and is frustoconical in shape. This core is surrounded by a casing 50. The casing 50 is sealed with respect to the core 49 by means of an O-ring seal 12.

The silane is supplied through the feed line 27. It emerges through an opening 30 which is in the shape of an annular wedge. The wall of this outlet 30 is formed on one side by the core section 49 and on the other side by the casing 50. The walls of the passage 30 are cooled. Behind the passage walls there are cooling-water chambers 28, through which cooling water flows in order to keep the wall temperature below the decomposition temperature of the silane.

The base surface 52, which is likewise held, as a result of application of cooling water from the rear, at a temperature at which the reaction gases do not decompose, is located approximately in the center of the process chamber and runs parallel to the surface of the carrier plate 3. In the center of the base surface 52 is located the opening 31 of the methane or propane feed line 26.

In order to insulate the cover plate 4, which during operation of the device has been heated to approximately 1600° C., from the cooled gas-admission element 6, there is an insulating sleeve 32 which is made from a carbon foam and is seated on the support 33.

The carrier plate 3 is driven in rotation via the supporting tube 24. The carrier plate 3 also has passages 54, through which gas flows, this gas emerging into helical grooves which are located at the base of cutouts. The substrate holders 45 are located in the cutouts. They rotate on a gas cushion of the gas.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. A device for depositing in particular crystalline layers on one or more, in particular likewise crystalline substrates in a process chamber by means of reaction gases which are introduced into the process chamber where they react pyrolytically, having a carrier plate which forms a wall of the process chamber which is heated from the rear, in particular using high frequency and consists of inert-coated graphite, having a gas-admission element, which is disposed in the center of the process chamber the chamber being circular in cross section, and is associated with a cover plate which consists of graphite and is disposed at a spacing from the carrier plate, and a gas-discharge ring which forms the outer boundary of the process chamber and has a multiplicity of radial gas outlet openings, characterized in that the gas-discharge ring is formed as a single-part consisting of solid graphite and is located in a radiation field of a high-frequency coil;

characterized in that the cover plate is heated from the rear;

characterized in that all the walls of the process chamber comprise solid graphite; and characterized in that the gas-discharge ring forms steps over which the cover plate engages and under which the carrier plate engages.

2. The device according to claim 1 or in particular according thereto, characterized in that the width of the gas-discharge ring approximately corresponds to the spacing between carrier plate and cover plate.

3. The device according to claim 2 or in particular according thereto, characterized in that the gas-discharge ring is in single-part form.

4. The device according to claim 3 or in particular according thereto, characterized in that the gas-discharge ring has an upper and a lower annular collar, the inner wall of which lies opposite the circumferential narrow wall of the carrier plate or of the cover plate.

5. The device according to claim 4 or in particular according thereto, characterized by annular protuberances which face outward and leave a U-shaped annular gap between them, into which annular gap the gas outlet openings open out.

6. The device according to claim 5 or in particular according thereto, characterized in that the material thickness of cover plate, carrier plate and gas-discharge ring is approximately equal.

7. The device according to claim 6 or in particular according thereto, characterized in that the gas-discharge ring is located in the radiation field of one of the two HF coils.

8. A device for depositing in particular crystalline layers on a crystalline substrate in a process chamber by means of reaction gases which are introduced into the process chamber, the device having a carrier plate which forms a wall of the process chamber which is heated from the rear by means of high frequency and comprises inert-coated graphite, having a gas-admission element, which is disposed in the center of the process chamber, and is associated with a cover plate which is disposed at a spacing from the carrier plate, and a gas-discharge ring which forms the outer boundary of the process chamber and has a multiplicity of radial gas outlet openings, wherein the gas-discharge ring comprises graphite and forms steps over which the cover plate engages and under which the carrier plate engages.

* * * * *